(12) United States Patent
Ma et al.

(10) Patent No.: US 11,276,755 B2
(45) Date of Patent: Mar. 15, 2022

(54) FIELD EFFECT TRANSISTORS WITH GATE ELECTRODE SELF-ALIGNED TO SEMICONDUCTOR FIN

(71) Applicant: Intel Corporation, Santa Clara, CA (US)

(72) Inventors: Sean T. Ma, Portland, OR (US); Matthew V. Metz, Portland, OR (US); Willy Rachmady, Beaverton, OR (US); Gilbert Dewey, Hillsboro, OR (US); Chandra S. Mohapatra, Beaverton, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 338 days.

(21) Appl. No.: 16/303,654

(22) PCT Filed: Jun. 17, 2016

(86) PCT No.: PCT/US2016/038208
§ 371 (c)(1),
(2) Date: Nov. 20, 2018

(87) PCT Pub. No.: WO2017/218014
PCT Pub. Date: Dec. 21, 2017

(65) Prior Publication Data
US 2020/0321435 A1     Oct. 8, 2020

(51) Int. Cl.
*H01L 21/70*     (2006.01)
*H01L 29/10*     (2006.01)
(Continued)

(52) U.S. Cl.
CPC .... *H01L 29/1054* (2013.01); *H01L 21/02532* (2013.01); *H01L 21/02546* (2013.01);
(Continued)

(58) Field of Classification Search
CPC ............. H01L 29/1054; H01L 29/0653; H01L 29/161; H01L 29/20; H01L 29/66522;
(Continued)

(56) References Cited

U.S. PATENT DOCUMENTS 6,924,517 B2   8/2005   Chen et al.
8,313,999 B2   11/2012   Cappellani et al.
(Continued)

FOREIGN PATENT DOCUMENTS

CN     1591899     3/2005
CN     101017823     8/2007
(Continued)

OTHER PUBLICATIONS

International Search Report and Written Opinion for International Patent Application PCT/US2016/038208, dated Mar. 16, 2017, 12 pgs.
(Continued)

*Primary Examiner* — Calvin Y Choi
(74) *Attorney, Agent, or Firm* — Essential Patents Group, LLP

(57) ABSTRACT

Monolithic FETs including a fin of a first semiconductor composition disposed on a sub-fin of a second composition. In some examples, an InGaAs fin is grown over GaAs sub-fin. The sub-fin may be epitaxially grown from a seeding surface disposed within a trench defined in an isolation dielectric. The sub-fin may be planarized with the isolation dielectric. The fin may then be epitaxially grown from the planarized surface of the sub-fin. A gate stack may be disposed over the fin with the gate stack contacting the (Continued)

planarized surface of the isolation dielectric so as to be self-aligned with the interface between the fin and sub-fin. Other embodiments may be described and/or claimed.

11 Claims, 10 Drawing Sheets

(51) Int. Cl.
H01L 21/02 (2006.01)
H01L 21/8258 (2006.01)
H01L 27/092 (2006.01)
H01L 29/06 (2006.01)
H01L 29/161 (2006.01)
H01L 29/20 (2006.01)
H01L 29/66 (2006.01)
H01L 29/78 (2006.01)

(52) U.S. Cl.
CPC .... H01L 21/02639 (2013.01); H01L 21/8258 (2013.01); H01L 27/0924 (2013.01); H01L 29/0653 (2013.01); H01L 29/161 (2013.01); H01L 29/20 (2013.01); H01L 29/66522 (2013.01); H01L 29/66545 (2013.01); H01L 29/66795 (2013.01); H01L 29/785 (2013.01)

(58) Field of Classification Search
CPC ......... H01L 29/66545; H01L 29/66795; H01L 29/785; H01L 21/02532; H01L 21/02546; H01L 21/02639; H01L 21/8258; H01L 27/0924
USPC ....................................................... 257/369
See application file for complete search history.

(56) References Cited

U.S. PATENT DOCUMENTS

| 8,648,400 | B2 | 2/2014 | Xu |
| 8,815,691 | B2 | 8/2014 | Colinge et al. |
| 8,946,908 | B2 | 2/2015 | Holmes et al. |
| 9,059,024 | B2 | 6/2015 | Glass et al. |
| 9,099,519 | B2 | 8/2015 | Shen et al. |
| 9,165,837 | B1 | 10/2015 | Fronheiser et al. |
| 9,171,925 | B2 | 10/2015 | Kuo et al. |
| 9,190,466 | B2 | 11/2015 | Yeh et al. |
| 9,196,548 | B2 | 11/2015 | Rashed et al. |
| 9,287,404 | B2 | 3/2016 | Poelzl et al. |
| 9,455,199 | B1* | 9/2016 | Jacob .................. H01L 27/0924 |
| 9,564,435 | B2 | 2/2017 | Chung et al. |
| 9,728,464 | B2 | 8/2017 | Glass et al. |
| 9,882,009 | B2 | 1/2018 | Glass |
| 9,953,885 | B2 | 4/2018 | Yuan et al. |
| 9,991,262 | B1 | 6/2018 | Ching et al. |
| 10,056,380 | B2 | 8/2018 | Ghani et al. |
| 10,446,685 | B2 | 10/2019 | Mohapatra et al. |
| 2006/0197129 | A1 | 9/2006 | Wohlmuth |
| 2007/0001173 | A1 | 1/2007 | Brask et al. |
| 2008/0073667 | A1 | 3/2008 | Lochtefeld |
| 2011/0014792 | A1 | 1/2011 | Kim |
| 2012/0231596 | A1 | 9/2012 | Majhi et al. |
| 2013/0001591 | A1 | 1/2013 | Wu et al. |
| 2013/0049068 | A1 | 2/2013 | Lin et al. |
| 2013/0175627 | A1 | 7/2013 | Goldbach et al. |
| 2013/0228875 | A1 | 9/2013 | Lee et al. |
| 2013/0234204 | A1 | 9/2013 | Kang et al. |
| 2013/0270612 | A1 | 10/2013 | Chien et al. |
| 2013/0313619 | A1 | 11/2013 | Fumitake |
| 2014/0054646 | A1 | 2/2014 | Vellianitis |
| 2014/0284726 | A1 | 9/2014 | Lee et al. |
| 2015/0048454 | A1 | 2/2015 | Colinge et al. |
| 2015/0102392 | A1* | 4/2015 | Yu ..................... H01L 29/1083 257/288 |
| 2015/0162404 | A1 | 6/2015 | Yang et al. |
| 2015/0187773 | A1 | 7/2015 | Niimi et al. |
| 2015/0303118 | A1* | 10/2015 | Wang ............. H01L 21/823431 257/401 |
| 2016/0049402 | A1 | 2/2016 | Liu et al. |
| 2016/0099352 | A1 | 4/2016 | Lee et al. |
| 2016/0190319 | A1 | 6/2016 | Kavalieros et al. |
| 2016/0211262 | A1 | 7/2016 | Jan et al. |
| 2018/0151695 | A1 | 5/2018 | Huang et al. |
| 2018/0248028 | A1 | 8/2018 | Mohapatra et al. |

FOREIGN PATENT DOCUMENTS

| CN | 102054741 | 5/2011 |
| CN | 103311306 | 9/2013 |
| CN | 103378156 | 10/2013 |
| CN | 103383965 | 11/2013 |
| CN | 103915325 | 7/2014 |
| CN | 104011870 | 8/2014 |
| CN | 104037088 | 9/2014 |
| CN | 104380443 | 2/2015 |
| CN | 104517856 | 4/2015 |
| CN | 104752507 | 7/2015 |
| CN | 104992979 | 10/2015 |
| EP | 1677350 | 7/2006 |
| TW | 201511277 | 3/2015 |
| TW | 201523875 | 6/2015 |
| WO | 2005098963 | 10/2005 |
| WO | 2014133293 | 9/2014 |
| WO | 2015026371 | 2/2015 |
| WO | 2015047253 | 4/2015 |

OTHER PUBLICATIONS

International Preliminary Report on Patentability from PCT/US2016/038208 notified Dec. 27, 2018, 9 pgs.
Partial Supplementary European Search Report from European Patent Application No. 16905666.0 notified Aug. 4, 2020, 14 pgs.
Extended European Search Report from European Patent Application No. 16905666.0 notified Nov. 4, 2020, 13 pgs.
Office Action from Chinese Patent Application No. 201680085822.1 notified Aug. 6, 2021, 29 pgs.

* cited by examiner

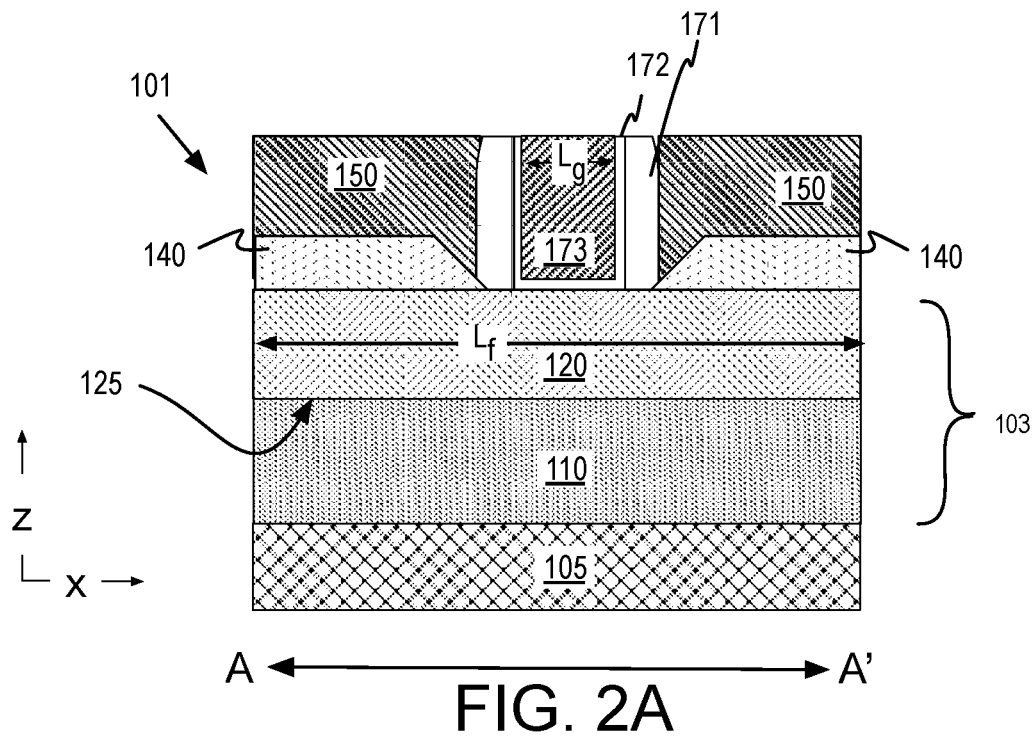
FIG. 2A
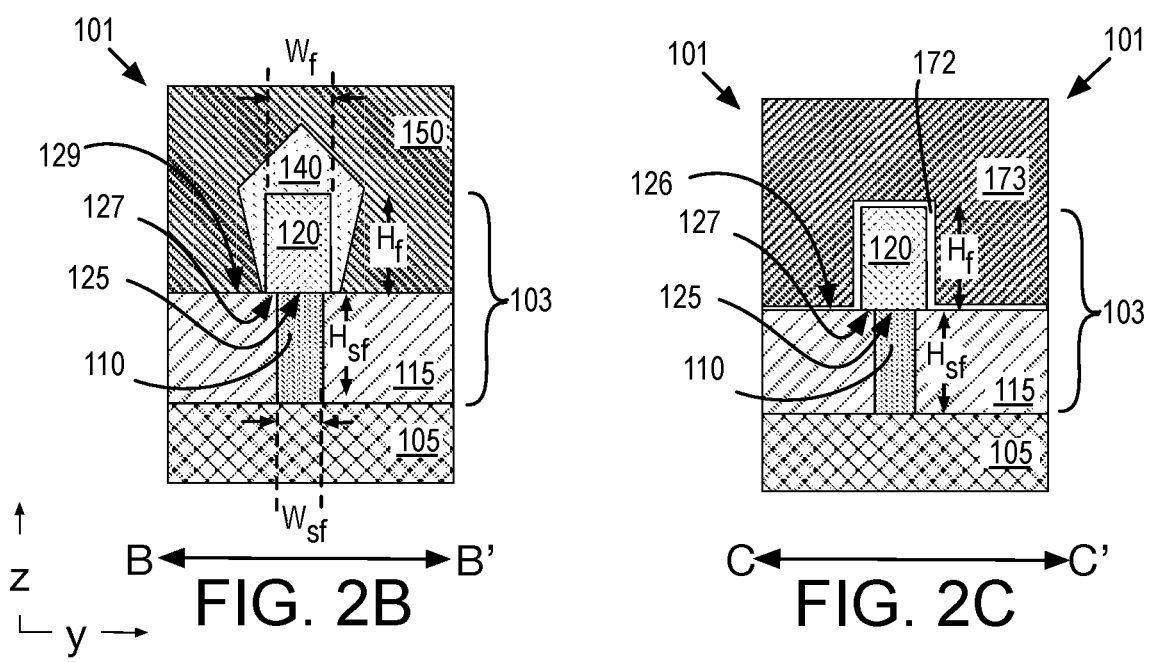
FIG. 2B
FIG. 2C

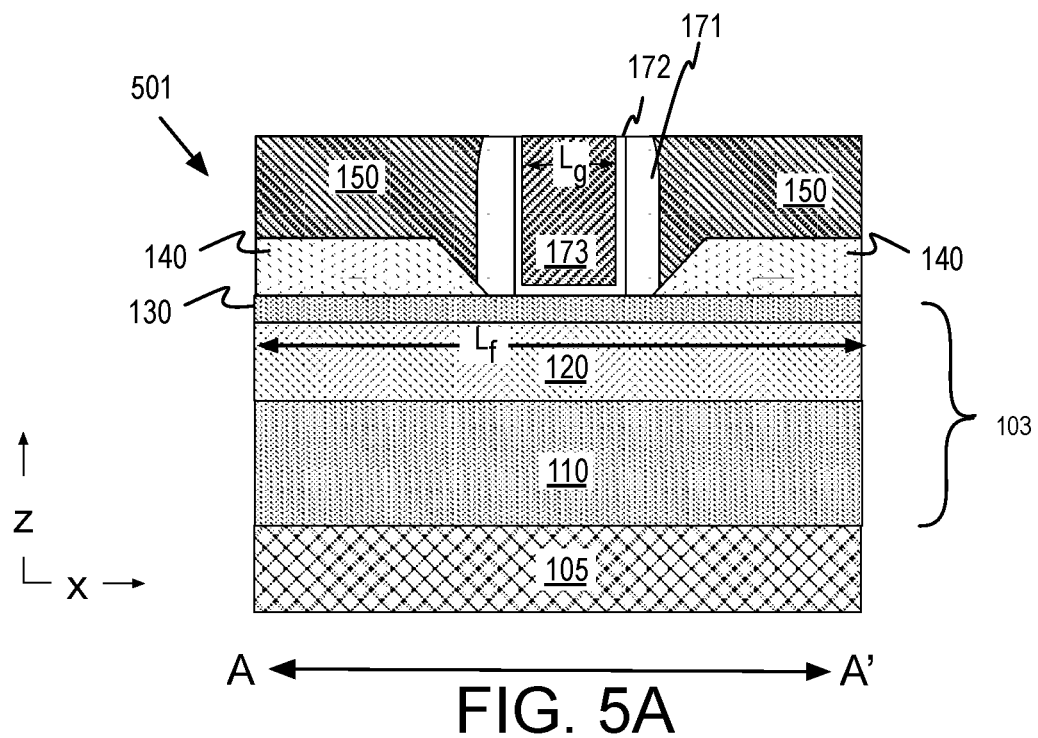
FIG. 5A
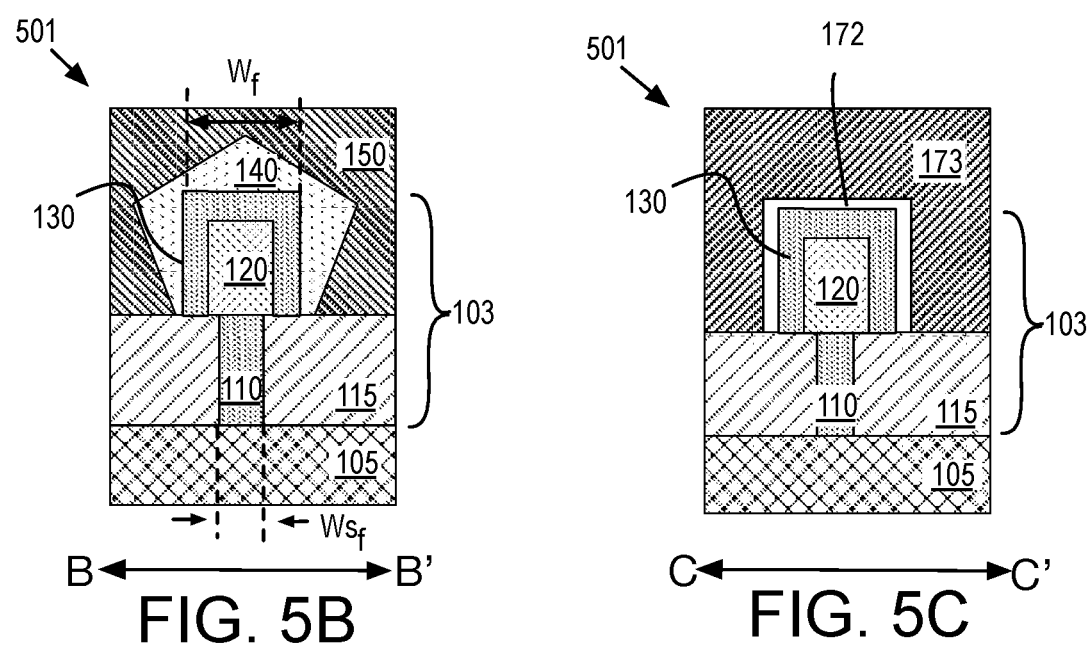
FIG. 5B
FIG. 5C

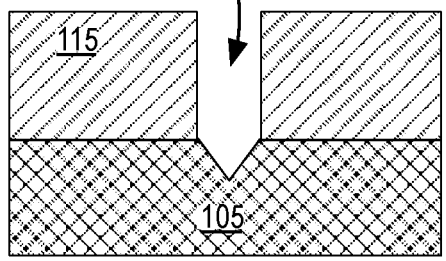
FIG. 7A  FIG. 7B
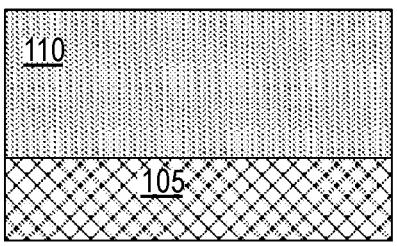
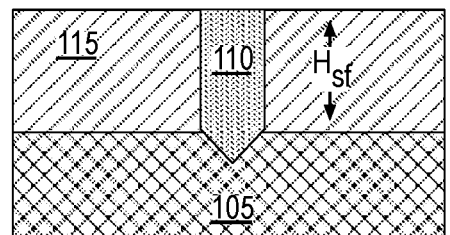
FIG. 8A  FIG. 8B
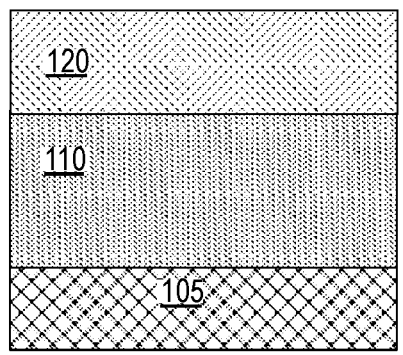
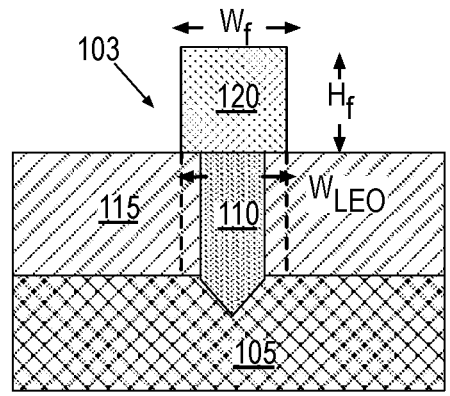
FIG. 9A  FIG. 9B

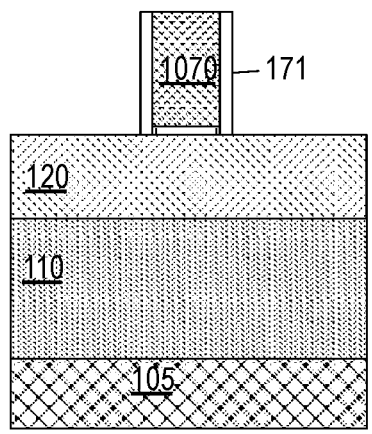
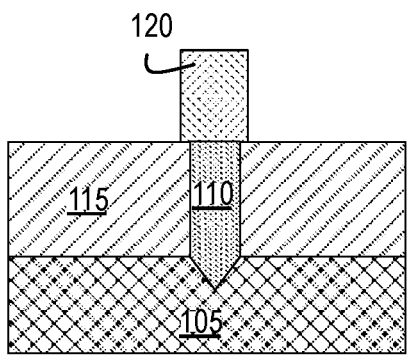
FIG. 10A    FIG. 10B
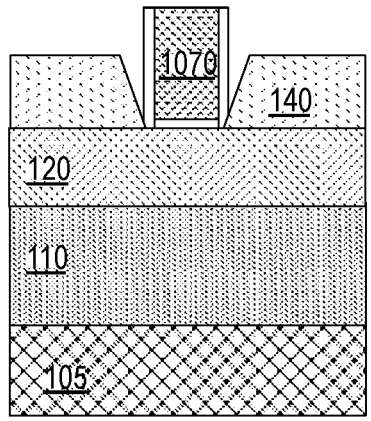
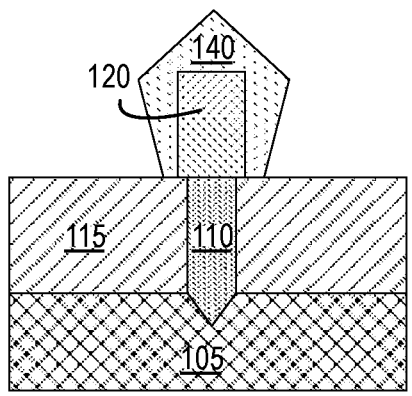
FIG. 11A    FIG. 11B
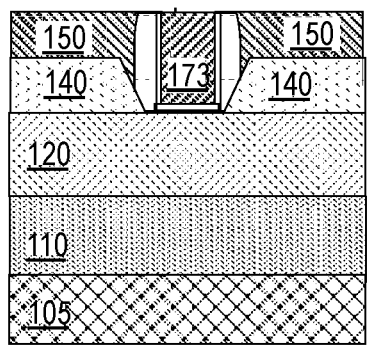
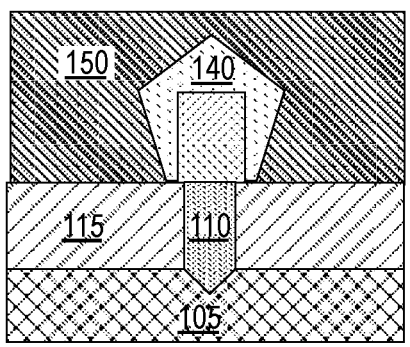
FIG. 12A    FIG. 12B

FIELD EFFECT TRANSISTORS WITH GATE ELECTRODE SELF-ALIGNED TO SEMICONDUCTOR FIN

CLAIM OF PRIORITY

This Application is a National Stage Entry of, and claims priority to, PCT Application No. PCT/US2016/038208, filed on Jun. 17, 2016 and titled "FIELD EFFECT TRANSISTORS WITH GATE ELECTRODE SELF-ALIGNED TO SEMICONDUCTOR FIN", which is incorporated by reference in its entirety for all purposes.

BACKGROUND

Efforts to extend Moore's law for integrated circuitry (IC) have included the development of non-planar transistors. Fin structures employed for materials other than silicon, such as Ge, SiGe, and III-V compound semiconductor materials (e.g., InP, InGaAs, InAs), may be heteroepitaxially grown from a silicon substrate. It may be advantageous to employ only a portion of such a junctioned fin structure as the transistor channel. For example, crystal quality of a top portion of the fin may be better than a remainder of the fin. As another example, a heteroepitaxial fin may include a stack of two or more compositionally distinct layers, only one of which has a bandgap, and/or carrier mobility, and/or doping level advantageous for a transistor channel.

Depending on the fin fabrication process, it may be difficult to precisely control the portion or layer of a semiconductor fin structure that is coupled to a gate electrode. This difficulty may lead to undesirable and/or variable transistor performance.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2A illustrates a cross-sectional view through a length of channel region and source/drain regions of the high-mobility finFET depicted in FIG. 1, in accordance with some embodiments;

FIG. 2B illustrates a cross-sectional view through a fin width within a source/drain region of the high-mobility finFET depicted in FIG. 1, in accordance with some embodiments;

FIG. 2C illustrates a cross-sectional view through a fin width within a channel region of the high-mobility finFET depicted in FIG. 1, in accordance with some embodiments;

FIG. 5A, 5B, 5C illustrate cross-sectional views through lengths and widths of the high-mobility finFET depicted in FIG. 1, in accordance with some alternate embodiments;

FIGS. 7A, 8A, 9A, 10A, 11A, and 12A illustrate cross-sectional views through a length of the channel region and source/drain regions of a high-mobility finFET evolving as the method illustrated in FIG. 6 is performed, in accordance with some embodiments;

FIGS. 7B, 8B, 9B, 10B, 11B, and 12B illustrate cross-sectional views through a width of a fin structure within a region of a high-mobility finFET evolving as the method illustrated in FIG. 6 is performed, in accordance with some embodiments;

DETAILED DESCRIPTION

Figure 1:
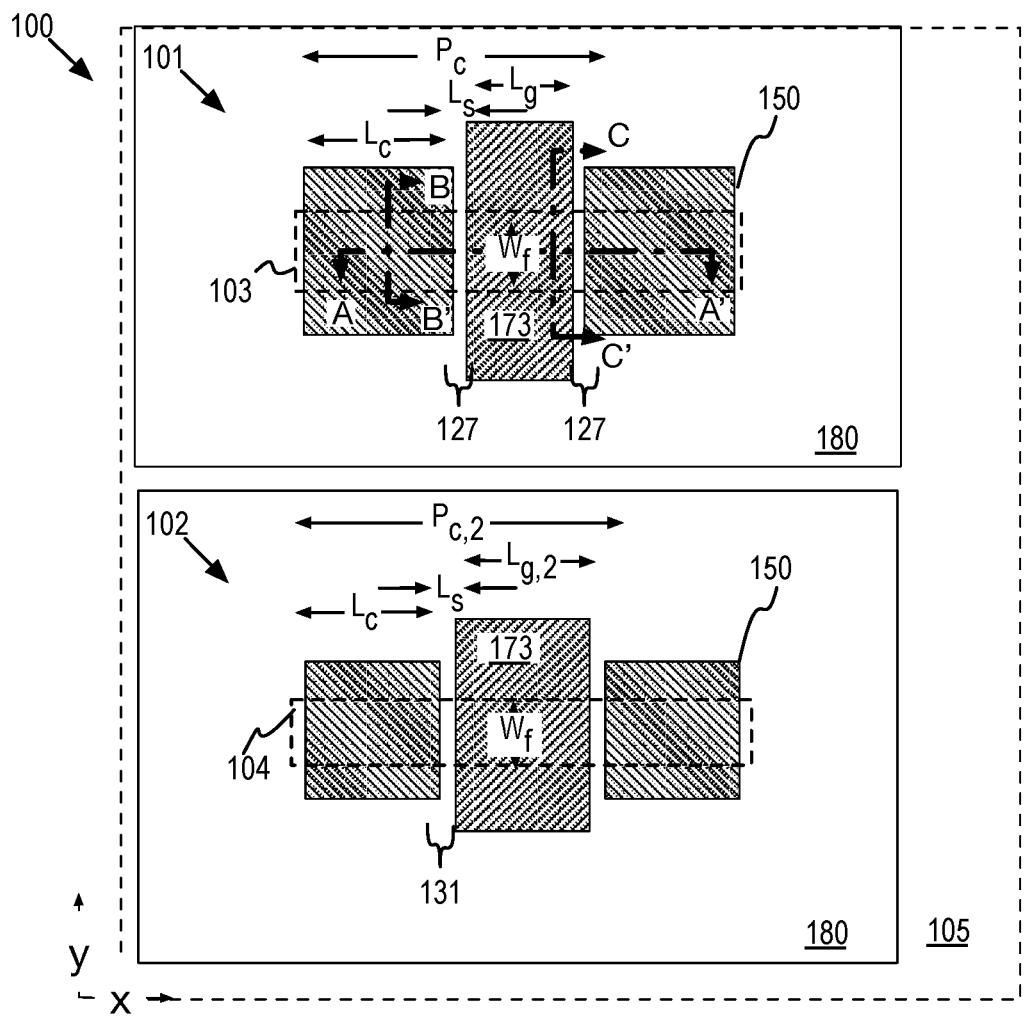
FIG. 1 is a plan view of an IC including a high-mobility finFET and silicon finFET disposed over a substrate, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In embodiments described further below, a crystalline semiconductor material is employed for a fin in which a transistor channel region resides. The semiconductor material may offer higher carrier mobility than that of silicon, for example. In some embodiments described herein, the fin semiconductor is disposed on a sub-fin comprising another crystalline semiconductor material, which may have a wider bandgap than the fin semiconductor, and/or bandgap offset from the fin semiconductor, and/or a different conductivity type than the fin semiconductor.

In some embodiments described further below, monolithic FETs include a sub-fin including a first semiconductor material disposed over a substrate. A dielectric field isolation material is disposed in contact with a sidewall of the sub-fin. A top surface of the field isolation may be substantially planar with a top surface of the sub-fin. A fin of a second semiconductor material is epitaxially grown on the planarized top surface of the sub-fin semiconductor. The fin material may laterally expand to overhang a portion of the field isolation. A gate stack is disposed over the fin within a channel region. The gate stack may land on the top surface of the field isolation. With the top surface of the field isolation planar to the interface of the fin and sub-fin, the gate stack is self-aligned to the fin semiconductor and does not contact a sidewall of the sub-fin. No portion of the fin is then ungated, benefiting off-state transistor performance. Furthermore, the gate electrode does not strongly couple to any portion of the sub-fin as it is not adjacent to any portion of the sub-fin sidewall. As such, there is no parasitic gate capacitance from the sub-fin for a given channel current, thus reducing gate delay (proportional to gate capacitance) in an IC employing such transistors.

In some advantageous embodiments, the fin semiconductor is not intentionally doped with any electrically active impurity and carrier mobility may be advantageously high within the channel region. A pair of heavily-doped semiconductor source/drain regions interface with the channel region. With the top surface of the field isolation planarized with the interface of the fin and sub-fin, the heavily-doped source/drain semiconductor may also be self-aligned to the fin semiconductor and may not contact any portion of the sub-fin sidewall.

FIG. 1 is a plan view of complementary metal-oxide-semiconductor (CMOS) circuitry 100 including a finFET 101 and a finFET 102 disposed over a substrate layer 105 and surrounded by a dielectric layer 180, in accordance with some embodiments. In the exemplary embodiment, finFET 101 is an NMOS device while finFET 102 is a PMOS device. At least finFET 101 has one or more of the structural attributes described further below. For such embodiments, finFET 102 may have any architecture including a silicon channel or other group IV semiconductor (e.g., Ge or SiGe) channel having higher hole mobility than silicon. In some embodiments, a high-mobility NMOS finFET 101 is coupled with a high-mobility PMOS finFET 102, both of which have one or more of the structural attributes described further below.

In some embodiments, substrate layer 105 is a silicon (Si), which may be advantageous for monolithic integration of finFETs 101 and 102. Crystallographic orientation of a substantially monocrystalline substrate layer 105 in exemplary embodiments is (100), (111), or (110). However, other crystallographic orientations are also possible. For example, the substrate working surface may be miscut, or offcut 2-10° toward [110] to facilitate nucleation of crystalline heteroepitaxial material. Other substrate layers are also possible. For example, substrate layer 105 may be any of silicon-carbide (SiC), sapphire, III-V compound semiconductor (e.g., GaAs), silicon on insulator (SOI), germanium (Ge), or silicon-germanium (SiGe). Substrate layer 105 may also comprise any thin film dielectric, and/or metal and/or semiconductor film deposited on a back-side of finFETs 101, 102 during back-side processing that preceded (or was subsequent to) the fabrication of finFETs 101, 102. Substrate layer 105 may also be any bulk dielectric, and/or metal, and or semiconductor to which a semiconductor layer was transferred before finFETs 101, 102 were fabricated in the transferred semiconductor layer, or to which the finFETs 101, 102 were transferred after their fabrication on a donor substrate. Dielectric layer 180 may include any dielectric material suitable for providing sufficient electrical isolation between transistors. In some exemplary embodiments, dielectric layer 180 is silicon dioxide. Other materials known to be suitable for the purpose may also be utilized, including low-k materials (e.g., having a relative permittivity below 3.5, as measured for a bulk material).

In the illustrated embodiment, finFET 101 is associated with a transistor cell area equal to the transistor cell area associated with finFET 102. Specifically, gate length $L_g$ associated with finFET 101 is equal to $L_{g,2}$ of finFET 102. Source/drain contact length $L_c$ and lateral spacing $L_s$ between source/drain contact metallization 150 and an edge of gate electrode 173 are both equivalent for the two finFETs 101, 102. As noted above, if the transistor gate electrode does not strongly couple to the entire sidewall of the channel semiconductor, off-state leakage current for a high-mobility channel material may be considerably higher than for a silicon-channeled device of comparable effective channel length and gate/drain overlap dependent on the lateral spacing $L_s$. Thus, in some embodiments, finFET 101 includes a gate electrode that is self-aligned to the high-mobility channel material to reduce off-state leakage associated with misalignment between the gate electrode and the high-mobility channel semiconductor. In some further embodiments where the channel of finFET 102 is Ge or SiGe, the gate electrode of finFET 102 is similarly self-aligned to the fin structure so that underlying sub-fin semiconductor is not also strongly coupled to the gate electrode. In some alternate embodiments, for example where the channel of finFET 102 is silicon, the gate electrode of finFET 102 is not self-aligned in the manner of finFET 101.

In some exemplary embodiments, at least transistor 101 includes a junctioned non-planar semiconductor body that further includes a crystalline "fin" semiconductor disposed on a crystalline "sub-fin" semiconductor. The compositions of the fin and sub-fin differ. In some advantageously embodiments the fin semiconductor and the sub-fin semiconductor comprise different crystal lattice constituents, and the junction at the interface between the sub-fin and fin is a semiconductor heterojunction. For example, in transistor 101, the sub-fin may be a first compound semiconductor with a first sub-lattice of at least one element from group III of the periodic table (e.g., Al, Ga, In), and a second sub-lattice of at least one element of group V of the periodic table (e.g., P, As, Sb) while the fin is a second compound semiconductor with a first sub-lattice of at least one group III element and a second sub-lattice of at least one group V element, at least one of which is different than that of the sub-fin. As another heterojunction example, in transistor 102, the sub-fin may be a first group IV semiconductor (e.g., Si or a first SiGe alloy), while the fin is a second, different, group IV semiconductor (e.g., Ge or a second SiGe alloy). In some embodiments, the junction between the sub-fin and fin is a dopant junction where an impurity concentration varies between the fin and sub-fin, but majority lattice constituents are the same between the sub-fin and fin. For example, where both the sub-fin and fin are the same group IV or group III-V semiconductor, the sub-fin and fin may be complementarily doped. The sub-fin may be n-type doped silicon while the fin is p-type doped silicon, as one specific example. In another dopant junction example where both the sub-fin and fin are the same group IV or group III-V semiconductor, the sub-fin may be doped more heavily than the fin (e.g., sub-fin doped and fin undoped). In some further embodiments, the junction between the sub-fin and fin is both a heterojunction and a dopant junction.

In accordance with some embodiments herein, the gate electrode of transistor 101 and/or 102 is self-aligned with a junction of the junctioned-semiconductor body of the transistor. The gate may be self-aligned to a junction along an axis orthogonal to the longitudinal axis of the fin. Whereas a gate electrode may be self-aligned along the longitudinal (x) axis to a channel portion of the fin in any conventional manner, in accordance with embodiments herein the gate electrode is further self-aligned along a second (z) axis, orthogonal to the longitudinal axis. Such self-alignment of the gate to the junction is to ensure that gate electrode is strongly coupled to all of the channel residing on the fin side of the junction, but is not strongly coupled to the sub-fin side of the junction. With self-alignment of the gate electrode as described further elsewhere herein, coupling between the sub-fin and gate electrode may be limited to fringe capacitance.

FIG. 2A illustrates a cross-sectional view through a longitudinal length of high-mobility finFET 101 along the A-A' plane denoted in FIG. 1, in accordance with some embodiments. FIGS. 2B and 2C illustrate cross-sectional views through a transverse fin width within source/drain and channel region of high-mobility finFET 101 along the B-B' and C-C' planes denoted in FIG. 1, in accordance with some embodiments.

As shown in FIG. 2A-2C, junctioned semiconductor body 103 includes a fin 120 disposed on a sub-fin 110. Sub-fin 110 has a sidewall contacted by field isolation 115 (FIG. 2B, 2C), which may include one or more layers of dielectric material suitable for providing electrical isolation between adjacent FETs. In some exemplary embodiments, field isolation 115 is silicon dioxide. Other known dielectric materials may also be employed, including low-k materials. Although embodiments are not limited in this respect, other exemplary materials include carbon-doped oxides (SiOC, SiOCH) and siloxane derivatives.

In some exemplary heterojunction embodiments, fin 120 is of a first semiconductor material having a first bandgap while sub-fin 110 is of a second semiconductor material having a second bandgap. The two different materials form a fin/sub-fin heterojunction 125 (FIG. 2A). Sub-fin 110 need not be of a material having high carrier mobility as sub-fin 110 is not to serve as part of the transistor channel In some advantageous embodiments, sub-fin 110 is a semiconductor material of suitable composition so that the heterojunction with fin 120 is associated with a band edge energy offset useful for reducing a substrate leakage current path from fin 120 through sub-fin 110. In some N-type transistor embodiments where fin 120 is to provide an electron channel, for example, sub-fin 110 may have a higher conduction band energy than fin 120 (i.e., positive CBO).

In some embodiments, sub-fin 110 and fin 120 are each monocrystalline semiconductors. In a first embodiment, sub-fin 110 and fin 120 are each compound semiconductors with a first sub-lattice of at least one element from group III of the periodic table (e.g., Al, Ga, In), and a second sub-lattice of at least one element of group V of the periodic table (e.g., P, As, Sb). Sub-fin 110 may be a binary, ternary, or quaternary III-V compound semiconductor that is an alloy of two, three, or even four elements from groups III and V of the periodic table. For exemplary N-type transistor embodiments, fin 120 is advantageously a III-V material having a high electron mobility, such as, but not limited to InGaAs, InP, InSb, and InAs. For some such embodiments, fin 120 is a ternary III-V alloy, such as InGaAs or GaAsSb. For some $In_xGa_{1-x}As$ fin embodiments, In content (x) is between 0.6 and 0.9, and advantageously is at least 0.7 (e.g., $In_{0.7}Ga_{0.3}As$). In some embodiments with highest mobility, fin 120 is intrinsic III-V material and not intentionally doped with any electrically active impurity. In alternate embodiments, a nominal impurity dopant level may be present within fin 120, for example to set a threshold voltage $V_t$, or to provide HALO pocket implants, etc. Even for impurity-doped embodiments however, impurity dopant level within fin 120 may be relatively low, for example below $10^{15}$ cm$^{-3}$, and advantageously below 10 cm$^{13}$. Sub-fin 110 is advantageously a III-V material having a significant band offset (e.g., conduction band offset for N-type devices) from fin 120. Exemplary materials, include, but are not limited to, GaAs, GaSb, GaAsSb, GaP, InAlAs, GaAsSb, AlAs, AlP, AlSb, and AlGaAs. In some N-type transistor embodiments where fin 120 is InGaAs, sub-fin 110 is GaAs, and may also be doped with impurities (e.g., p-type) to a greater impurity level than fin 120.

In some alternate heterojunction embodiments, a sub-fin and fin are each group IV semiconductors (e.g., Si, Ge, SiGe). FinFET 102 (FIG. 1) may have such a composition, for example, and have sub-fin and fin components substantially as introduced in FIG. 2A-2C for finFET 101. For group IV embodiments, the sub-fin may be a first elemental semiconductor (e.g., Si or Ge) or a first SiGe alloy (e.g., having a wide bandgap). For exemplary P-type transistor embodiments, the fin is advantageously a group IV material having a high hole mobility, such as, but not limited to Ge or a Ge-rich SiGe alloy. For some exemplary embodiments, the fin has a Ge content between 0.6 and 0.9, and advantageously is at least 0.7. In some embodiments with highest mobility, the fin is intrinsic semiconductor material and not intentionally doped with any electrically active impurity. In alternate embodiments, one or more a nominal impurity dopant level may be present within the fin, for example to set a threshold voltage $V_t$, or to provide HALO pocket implants, etc. Even for impurity-doped embodiments however, impurity dopant level within the fin is relatively low, for example below $10^{15}$ cm$^{-3}$, and advantageously below $10^{13}$ cm$^{-3}$. The sub-fin is advantageously a group IV material having a significant band offset (e.g., valance band offset for P-type devices) from the fin. Exemplary materials, include, but are not limited to, Si or Si-rich SiGe. In some P-type transistor embodiments, the sub-fin is Si and may also be doped with impurities (e.g., n-type) to a higher impurity level than the fin.

In some embodiments, an interface of a transistor gate stack and field isolation is aligned with an interface of fin and sub-fin semiconductor. Alignment of these two interfaces is indicative of a self-aligned fabrication process as a sampling of transistors fabricated by a non-self-aligned process would inherently display some non-planarity between these interfaces. As shown in FIG. 2A, junctioned-semiconductor body 103 has a longitudinal fin length $L_f$ extending between the transistor source and drain along a longitudinal axis of fin 120. Fin 120 and sub-fin 110 form a heterojunction that extends parallel to the longitudinal fin axis along fin length $L_f$. As shown in FIG. 2C, heterojunction 125 is aligned in the z-axis (e.g., planar) with interface 126 of field isolation 115 and a gate stack that includes gate dielectric 172 and gate electrode 173. Depending on the embodiment, interface 126 may be between field isolation 115 and either a gate dielectric or a gate electrode. For example, where gate dielectric is selectively formed on only fin 120, interface 126 is between field isolation 115 and gate electrode 173. In other embodiments where the gate dielectric is non-selectively deposited over both the fin and adjacent field isolation, interface 126 is between the field isolation and the gate dielectric.

While any materials known to be suitable for a gate stack may be utilized, in some exemplary embodiments a high-k material having a bulk relative permittivity of 9, or more, is employed as gate dielectric 172 along with a gate metal that has a work function suitable for the composition of fin 120. Exemplary high-k dielectric materials include metal oxides, such as, but not limited to HfO$_2$, Al$_2$O$_3$, and metal silicates, such as, but not limited to HfSiO$_x$ and AlSiO$_x$. In the embodiments illustrated by FIG. 2C, gate dielectric 172 is disposed directly on sidewalls of fin 120. As further shown in FIG. 2A, on either side of the gate stack are gate sidewall spacers 171, which may be of any dielectric material. Gate sidewall spacers 171 may be in contact with a sidewall of gate electrode 173, or as shown, in contact with (high-k) gate dielectric 172 that covers sidewalls of gate electrode 173. The lateral dimensions of gate sidewall spacers 171 may vary anywhere from 1 to 10 nm, for example. In some exemplary embodiments, gate sidewall spacers 171 provide 2-5 nm of lateral spacing between gate electrode 173 and semiconductor source/drain region 140.

In some embodiments, an interface between fin and sub-fin semiconductor is aligned with an interface of field isolation and at least one of source/drain semiconductor and source/drain contact metallization. Alignment of these interfaces is further indicative of a self-aligned source/drain fabrication process. As shown in FIG. 2B, heterojunction 125 is aligned (e.g., planar) with interface 129 of field isolation 115 and contact metallization 150. In some exemplary embodiments also represented by FIG. 2B, an interface between source/drain semiconductor 140 and field isolation 115 is also planar with heterojunction 125

Source/drain semiconductor 140 is heavily-doped, for example having an (n-type) impurity concentration of at least $10^{16}$ cm$^{-3}$. In some embodiments, impurity-doped source/drain region 140 is a compound semiconductor. In some III-V semiconductor fin embodiments, the compound semiconductor comprises a first sub-lattice of at least one element from group III of the periodic table (e.g., Al, Ga, In), and a second sub-lattice of at least one element of group V of the periodic table (e.g., P, As, Sb). Source/drain semiconductor 140 may be a binary, ternary, or quaternary III-V compound semiconductor that is an alloy of two, three, or even four elements from groups III and V of the periodic table. In some advantageous embodiments, source/drain semiconductor 140 is monocrystalline, having the same crystal orientation as fin 120. In some embodiments where fin 120 comprises a Ga and/or As alloy, source/drain semiconductor 140 is also a Ga and/or As alloy.

A junctioned semiconductor body may include a fin that laterally overhangs a region of the substrate beyond an edge or sidewall of the sub-fin. For such embodiments, the maximum transverse fin width of the fin may be greater than that of the sub-fin. A difference in the lateral dimensions of the fin and sub-fin is indicative of self-aligning the gate electrode to the fin, as further illustrated elsewhere herein. FIGS. 2B and 2C illustrate a transverse fin width $W_f$ that is greater than transverse sub-fin width $Ws_f$ associated with sub-fin 110. The transverse fin width $W_f$ may vary anywhere from 3 to 10 nm, for example. Fin 120 has a height $H_f$ (e.g., z-dimension in FIG. 2A-2C) that may vary to achieve a given current-carrying cross-sectional fin area. Fin height $H_f$ may be significantly larger (e.g., 10-50 nm, or more) than the transverse width $W_f$. Notably, the significant lateral overhang illustrated in FIG. 2B, 2C need not be present in some embodiments, for example where an isotropic fin etchback is performed to remove the overhang.

As further shown in FIG. 2C, fin 120 laterally overhangs field isolation 115 within the channel region of FET 101, forming an interface 127 between the fin semiconductor and a top surface of field isolation 115. Such a semiconductor/dielectric interface is indicative of lateral epitaxial overgrowth (LEO) of fin 120. As shown in FIG. 2B, fin 120 also laterally overhangs field isolation 115 within the source/drain region of FET 101. The extent of the lateral overhang is indicative of the epitaxial growth process employed to form fin 120. In the illustrative embodiment, fin 120 extends laterally over field isolation 115 by a distance that is less than half fin height $H_f$, which is indicative of growth conditions (e.g., partial pressures, temperature, etc.) that favor fastest fin growth normal to the substrate surface. The transverse width $W_f$ is approximately the sum of sub-fin width $W_{sf}$ plus twice the lateral overhang associated with interface 127.

Figure 3:
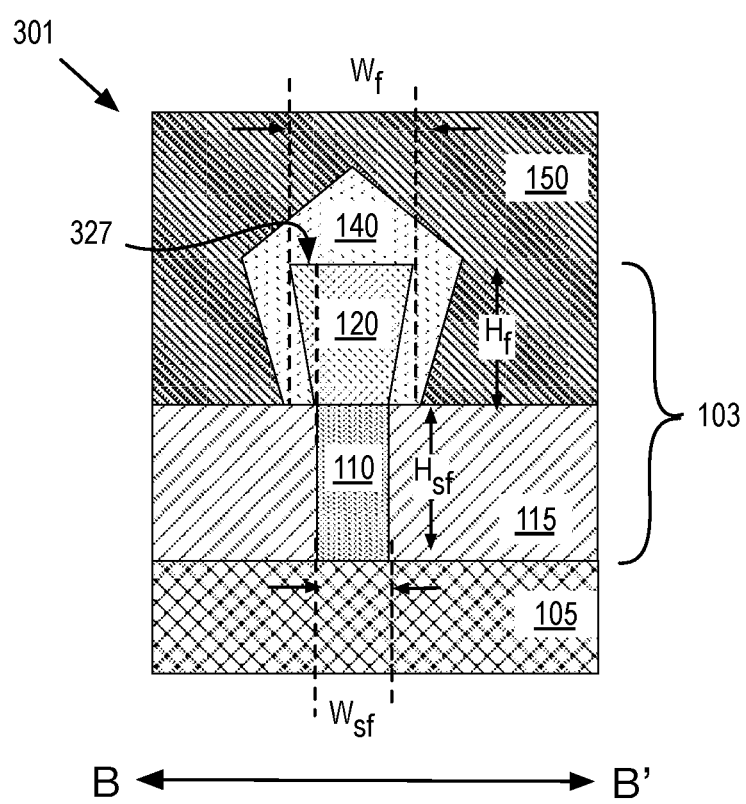
FIG. 3 illustrates a fin width within a source/drain region of the high-mobility finFET depicted in FIG. 1, in accordance with some alternate embodiments.

Notably, a semiconductor body may include more than one junction, and the gate stack may then be self-aligned to a desired one of the semiconductor junctions. Whereas fin 120 is in direct contact with field isolation 115 in the example of FIG. 2B, for the embodiment illustrated in FIG. 3 transistor 301 includes a semiconductor fin 120 that also laterally overhangs the top surface of the field isolation 115, but is not in direct contact with field isolation 115. For transistor 301, fin 120 has a trapezoidal and/or reentrant profile with the transverse width of fin 120 increasing with fin height $H_f$. Here, a base of fin 120 has a transverse width equal to that of the top surface of the sub-fin 110, and a top surface of fin 120 has a transverse width greater than that of the top surface of the sub-fin 110. Such a semiconductor/dielectric interface is indicative of epitaxial growth conditions accelerating deposition near outside corners of the fin. For such embodiments, semiconductor fin 120 extends over field isolation 115 by a lateral overhang 327. The maximum transverse width of fin 120 being approximately the sum of sub-fin width $W_{sf}$ plus twice the lateral overhang 327.

Figure 4A:
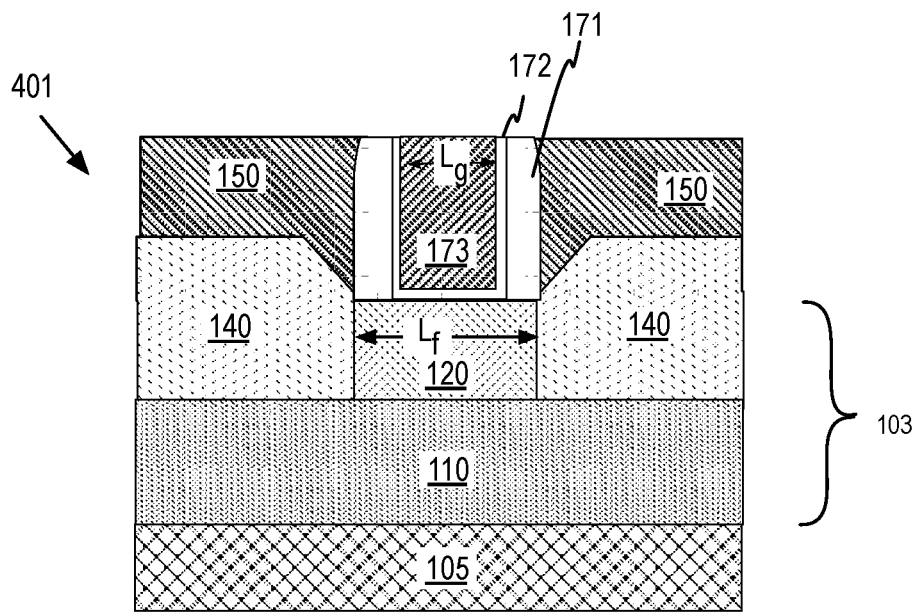
FIG. 4A, 4B, 4C illustrate cross-sectional views through lengths and widths of the high-mobility finFET depicted in FIG. 1, in accordance with some alternate embodiments.
Figure 4B:
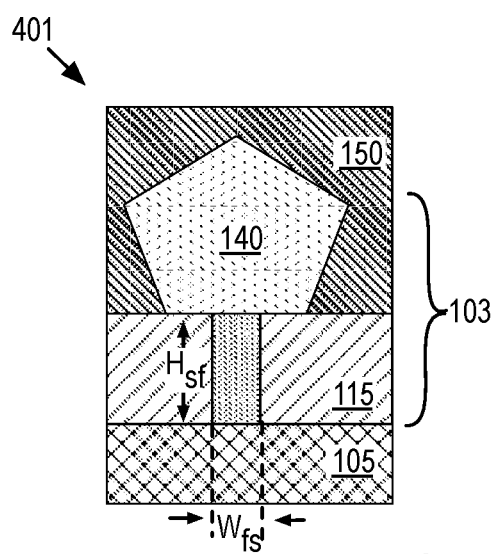
Figure 4C:
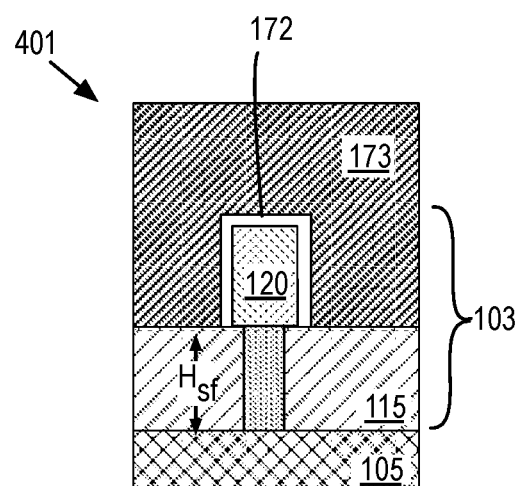

In some embodiments, heavily doped source/drain semiconductor may be disposed directly on sub-fin semiconductor, forming a heterojunction that is aligned (e.g., planar) with a heterojunction of fin semiconductor and sub-fin semiconductor. For such embodiments, the only fin semiconductor present may be disposed within the channel region over which the gate stack is disposed. Hence, in addition to the gate stack being self-aligned, regrown source/drain semiconductor may also be self-aligned to the fin/sub-fin junction. As shown in FIG. 4A-4C for example, transistor 401 includes heavily-doped semiconductor 140 forming a heterojunction with sub-fin 110 that is aligned (e.g., planar) with a heterojunction of semiconductor fin 120 and sub-fin 110. Junctioned semiconductor body 103 therefore includes a fin 120 that has a longitudinal length $L_f$ that only extends between the junctions of fin 120 and source/drain 140. As further shown in FIG. 4B, the interface of source/drain semiconductor 140 to field isolation 115 is aligned (e.g., planar) with the interface (e.g., heterojunction) of fin 120 and sub-fin 110. As further shown in FIG. 4C, the interface of gate electrode 173 and field isolation 115 is likewise aligned (e.g., planar) with the interface of fin 120 and sub-fin 110. For the exemplary embodiments illustrated in FIGS. 4B and 4C, both source/drain semiconductor 140 and fin 120 laterally overhang field isolation 115. In some embodiments, source/drain semiconductor 140 has a larger lateral overhang beyond a sidewall of sub-fin isolation 110 than does fin 120. These overhangs are indicative of self-aligned epitaxial growths, as described further elsewhere herein.

FIG. 5A-5C, illustrate a transistor 501 including a junctioned semiconductor body 103 that further includes a fin cladding 130. Fin cladding 130 is of a different semiconductor material than fin 120. In advantageous embodiments, fin cladding 130 is monocrystalline, having the same crystal orientation as fin 120. The two different materials form a fin/cladding heterojunction. In the exemplary embodiment, fin cladding 130 extends the entire longitudinal fin length $L_f$ between source/drain semiconductor 140 (FIG. 3A) and is disposed on a longitudinal sidewall of fin 120 (FIG. 5B-C). Cladding 130 may be a continuous film separating fin 120 from a gate stack including gate dielectric 172 and gate electrode 173. In some advantageous embodiments, fin cladding 130 is a material of suitable composition so that a heterojunction with fin 120 is associated with a band edge energy offset useful for reducing a band-band tunneling between fin 120 and drain semiconductor 140. In some N-type transistor embodiments where fin 120 is to provide the major portion of the electron channel, cladding 130 may have a higher conduction band energy (i.e., positive CBO). In other embodiments, fin cladding 130 may facilitate transistor threshold tuning and/or impart strain within fin 120.

In some embodiments, cladding 130 is a monocrystalline compound semiconductor with a first sub-lattice of at least one element from group III of the periodic table (e.g., Al, Ga, In), and a second sub-lattice of at least one element of group V of the periodic table (e.g., P, As, Sb). Cladding 130 may be a binary, ternary, or quaternary III-V compound semiconductor that is an alloy of two, three, or even four elements from groups III and V of the periodic table. For exemplary N-type transistor embodiments, cladding 130 is advantageously a III-V material having relative large bandgap, such as, but not limited to InGaAs, InP, GaAs, AlGaAs. For some exemplary embodiments, where fin 120 is a ternary III-V alloy, such as InGaAs, fin cladding 130 is also a ternary III-V alloy, such as InGaAs, but with a different alloy composition. In some embodiments, where cladding 130 and fin 120 both comprise Ga and/or As alloys, fin 120 has a higher concentration of In than does fin cladding 130. In some embodiments where fin 120 is $In_xGa_{1-x}As$, cladding 130 is $In_xGa_{1-x}As$ that is more Ga-rich than fin 120. In some such embodiments, In content x is between 0.6 and 0.9 within fin 120, while x within cladding 130 is advantageously no more than 0.55, and advantageously between 0.30 and 0.55. In some embodiments, cladding 130 is intrinsic III-V material and not intentionally doped with any electrically active impurity. In alternate embodiments, one or more a nominal impurity dopant level may be present within fin cladding 130. Even for impurity-doped embodiments however, impurity dopant level within fin cladding 130 is relatively low, for example below $10^{15}$ cm$^{-3}$, and advantageously below $10^{13}$ cm$^{-3}$. The thickness of cladding 130 may vary anywhere from 1 to 5 nm, for example. In some exemplary embodiments where fin 120 has a transverse width of 2-5 nm, cladding 130 has a thickness of 1.5-3 nm such that the transverse width of the cladded fin is 5-11 nm.

In other embodiments, cladding 130 may be a group IV semiconductor, such as, Si, SiGe, or Ge. For such embodiments, the fin and cladding interface may be a heterojunction or simply a dopant junction. The fin/cladding junction may therefore be any of those described above for the sub-fin/fin junction and for a given transistor, the fin/cladding junction may be the same as, or different than, the sub-fin/fin junction.

As illustrated in FIGS. 5A and 5C, cladding 130 is disposed below (or covered by) gate electrode 173 and gate dielectric 172. For this embodiment as well, the interface of the gate stack (e.g., gate electrode 173) and field isolation 115 is aligned (e.g., planar) with the junction of fin 120 and sub-fin 110. As also shown, the interface of cladding 130 and field isolation 115 is aligned with the interface of the gate stack and field isolation 115. For transistor 501, the transverse width of fin 120 is larger than that of sub-fin 110 (i.e., fin 120 overlaps sub-fin 110). In alternate embodiments however, the transverse width of fin 120 is equal to that of sub-fin 110 with only cladding 130 then laterally overhanging sub-fin 110.

FinFETs in accordance with the self-aligned gate architectures above may be fabricated by a variety of methods applying a variety of techniques and processing chamber configurations. Generally, a sub-fin of semiconductor material is first formed following any known techniques. In some embodiments, numerous islands of III-V or group IV material is grown over a silicon substrate having a plurality of seeding surface regions. In some such embodiments, seeding surface regions are surrounded by high aspect ratio sidewalls to practice aspect ratio trapping (ART) and achieve acceptable crystal quality in a heteroepitaxial sub-fin material. The ART technique is one example of local additive heteroepitaxial sub-fin fabrication, which may advantageously reduce the effects of lattice mismatch across various substrate/sub-fin heterojunctions. In alternative embodiments, a conventional subtractive technique may be employed in which a blanket III-V or group IV semiconductor layer(s) is grown over, or transferred to, a working surface of a substrate. That blanket III-V layer is then etched into sub-fins. Once sub-fin is fabricated, the sub-fin is planarized with surrounding field isolation and the fin then grown epitaxially on an exposed top surface of the sub-fin. The gate stack and source/drain regions are then formed over the fin by any technique. With the fin grown from a seeding surface of the sub-fin that was planarized with the field isolation, any portion of the gate stack and/or source/drain semiconductor that is formed on the fin is precluded from forming on the sub-fin which remains fully embedded in the field isolation.

Figure 6:
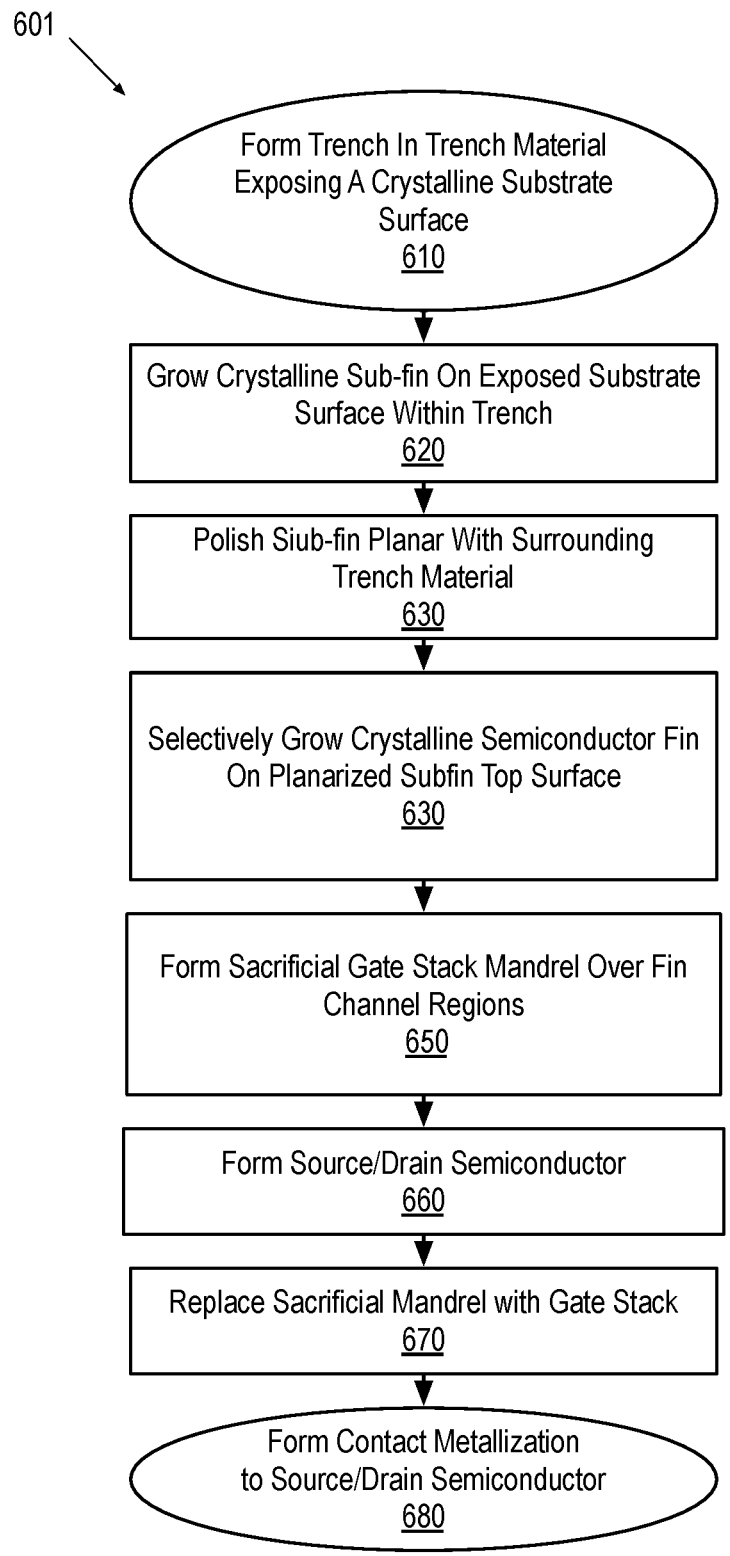
FIG. 6 is a flow diagram illustrating a method of fabricating a high-mobility finFET including a gate electrode self-aligned with a semiconductor fin, in accordance with some embodiments.

FIG. 6 is a flow diagram illustrating exemplary methods 601 for fabricating a high-mobility finFET with a gate electrode self-aligned to a semiconductor fin, in accordance with some embodiments. FIGS. 7A, 8A, 9A, 10A, 11A, and 12A illustrate cross-sectional views along the A-A' plane of finFET 101 evolving as the methods 601 are performed, in accordance with some embodiments. FIGS. 7B, 8B, 9B, 10B, 11B, and 12B illustrate cross-sectional views along the B-B' plane of finFET 101 evolving as methods 601 are performed, in accordance with some embodiments.

In reference to FIG. 6, methods 601 begin at operation 610 where a trench is formed in a trench material disposed over a substrate. The trench may be etched completely through a z-thickness of the trench material, exposing a crystalline substrate surface that is to seed a subsequent epitaxial growth. In the exemplary embodiment illustrated in FIG. 7A, 7B, a trench 710 is anistropically etched into dielectric field isolation 115, exposing a portion of substrate layer 105 at the bottom of trench 710. In some embodiments, the exposed portion of substrate layer 105 is recessed etched. In the illustrated example, a recess with positively sloped sidewalls is etched into substrate layer 105, which may further enhance trapping of crystalline defects (e.g., dislocations) in a subsequently grown crystalline sub-fin material. Although dimensions of trench 710 may vary, the aspect ratio (z-depth:y-dimension) is advantageously at least 2:1 and more advantageously 3:1, or more. In some embodiments, trench 710 has a CD of between 10 and 200 nm. However, trench material z-thickness and CD may be scaled as needed to maintain a workable aspect ratio for a predetermined sub-fin height selected for a desired transistor current carrying width.

Returning to FIG. 6, methods 601 continue at operation 620 where a crystalline sub-fin is epitaxially grown from the substrate surface exposed at the bottom of the trench formed at operation 610. Any epitaxial growth technique, such as, but not limited to, metal-organic chemical vapor deposition (MOCVD), molecular beam epitaxy (MBE), or hydride vapor phase epitaxy (HYPE) may be utilized at operation 620 to completely back fill the trench. Any overburden of the semiconductor sub-fin epitaxial growth is then planarized with a top surface of field isolation 115. Any planarization process known to be suitable for the compositions of the sub-fin and field isolation may be practiced at operation 630. In the exemplary embodiment illustrated in FIG. 8A, 8B, sub-fin 110 is epitaxially grown selectively to the substrate seeding surface to completely back fill trench 710. A chemical-mechanical planarization (CMP) process is then performed to planarize the top surface of sub-fin 110 with the top surface of field isolation 115.

At operation 630 (FIG. 6), fin semiconductor is selectively grown on the exposed top surface of the sub-fin semiconductor. Feed gases and other epitaxial process control parameters (e.g., temperature, partial pressures, etc.) may be selected as needed to epitaxially grow the fin semiconductor from the sub-fin semiconductor surface. Such a growth will proceed to form a semiconductor mesa self-aligned to the sub-fin surface. As such, the interface between the sub-fin and fin are aligned with the top surface of the field isolation. In further embodiments where an intervening interfacial material is to be included in a junctioned semiconductor body, operation 630 may further include multiple growth parameter/feed gas changes following any known technique. In some embodiments, growing the fin comprises growing a III-V semiconductor material, for example having a second alloy composition with a narrower bandgap than that of the sub-fin. In some embodiments, crystalline InGaAs is grown at operation 630. After epitaxial fin growth, the fin extends from the surrounding trench material. In the exemplary embodiment illustrated in FIGS. 9A and 9B, fin 120 extends a height above and laterally overhangs field isolation 115 following operation 630.

Methods 601 may continue with epitaxially growing any additional semiconductor layers on the exposed surfaces of the fin, such as, but not limited to, a fin cladding. In some embodiments, the fin may also be etched at this point in the fabrication process, thereby reducing the fin dimensions (e.g., isotropically). Any wet or dry etch process known to be suitable for the alloy composition of the fin may be utilized with the caveat that such an etch should not recess the surrounding field isolation significantly below the sub-fin/fin interface.

Returning to FIG. 6, methods 601 continue at operation 650 where a channel mask is patterned to protect a portion of the fin that is to become the FET channel region. While any known masking technique and material(s) may be employed at operation 650, in some embodiments, the channel mask is a sacrificial gate mandrel retained through a number of processes until being replaced in a "gate-last" finFET fabrication flow. Such embodiments may be advantageously compatible with silicon-channeled finFET fabrication, for example enabling PMOS transistors to be concurrently fabricated in other regions of the substrate (e.g. FET 102 in FIG. 1). Any known sacrificial gate structure and fabrication techniques may be employed at operation 650. In some embodiments, sacrificial gate material is blanket deposited and patterned into gate mandrel stripes. In alternative embodiments, operation 650 entails dielectric deposition and planarization, as well as patterning an opening in the dielectric exposing the fin structure, and backfilling the opening with a sacrificial gate.

In the exemplary embodiment illustrated in FIGS. 10A and 10B, a sacrificial gate 1070 is formed over a portion of fin 120. Sacrificial gate 1070 may be disposed directly on fin 120, as shown in FIG. 10A. Where sacrificial gate 1070 is formed before any etchback of field isolation 115, sacrificial gate 1070 may form an interface with field isolation 115 that is planar with the interface of sub-fin 110 and fin 120. Sacrificial gate 1070 may be patterned into a sacrificial mandrel extending over the channel region fin 120 and landing on field isolation 115. Other portions of fin 120 are exposed following the mandrel etch. In further embodiments represented by FIG. 10A, the channel mask further includes gate sidewall spacer 171 adjacent to sacrificial gate mandrel 1070. Any conventional self-aligned lateral spacer process may be employed at operation 650 to laterally stand-off subsequent processing from sacrificial gate 1070. For example, a dielectric (e.g., silicon dioxide and/or silicon nitride) may be conformally deposited over the hetero-fin and over the channel mask, and an anisotropic etch employed to clear the dielectric except along edges of topography.

Returning to FIG. 6, methods 601 continue at operation 660 where impurity-doped source/drain semiconductor material is epitaxially grown on surfaces of the fin not protected by the channel mask. Sub-fin semiconductor may remain protected by field isolation dielectric if it was not significantly recessed during fabrication of the sacrificial gate. As further illustrated in FIG. 11A, 11B, a doped III-V or group IV source/drain region 140 is grown by any epitaxial growth process. For example, any of MOCVD, MBE, HYPE, or the like, may be employed to grow semiconductor material with in-situ impurity doping. In some embodiments, a ternary source/drain material (e.g., InGaAs or GaAsSb) or a binary (e.g., InAs or GaSb) is grown.

Returning to FIG. 6, methods 601 continue at operation 670 where the channel mask is replaced with a permanent gate stack. Methods 601 are then substantially completed with any suitable contact metallization and backend processing performed at operation 680. For the exemplary embodiment further illustrated in FIGS. 12A and 12B, sacrificial gate 1070 is removed selectively relative to the underlying semiconductor fin, thereby exposing fin semiconductor within the lateral channel region. A permanent gate stack including a gate dielectric 172 and gate electrode 173 is formed over at least a sidewall of the fin structures, as depicted. While any known gate stack materials may be utilized, in one exemplary embodiment a high-k dielectric material is deposited along with a metal gate electrode having a work function suitable for a III-V semiconductor fin 120. As further illustrated in FIGS. 12A and 12B, source/drain contact metallization 150 is formed for example by depositing Ti and/or TiN on doped semiconductor source/drain 140. The structure of finFET 101 is then substantially complete as introduced in FIGS. 1-2C, and is ready for backend processing following any known techniques.

Figure 13:
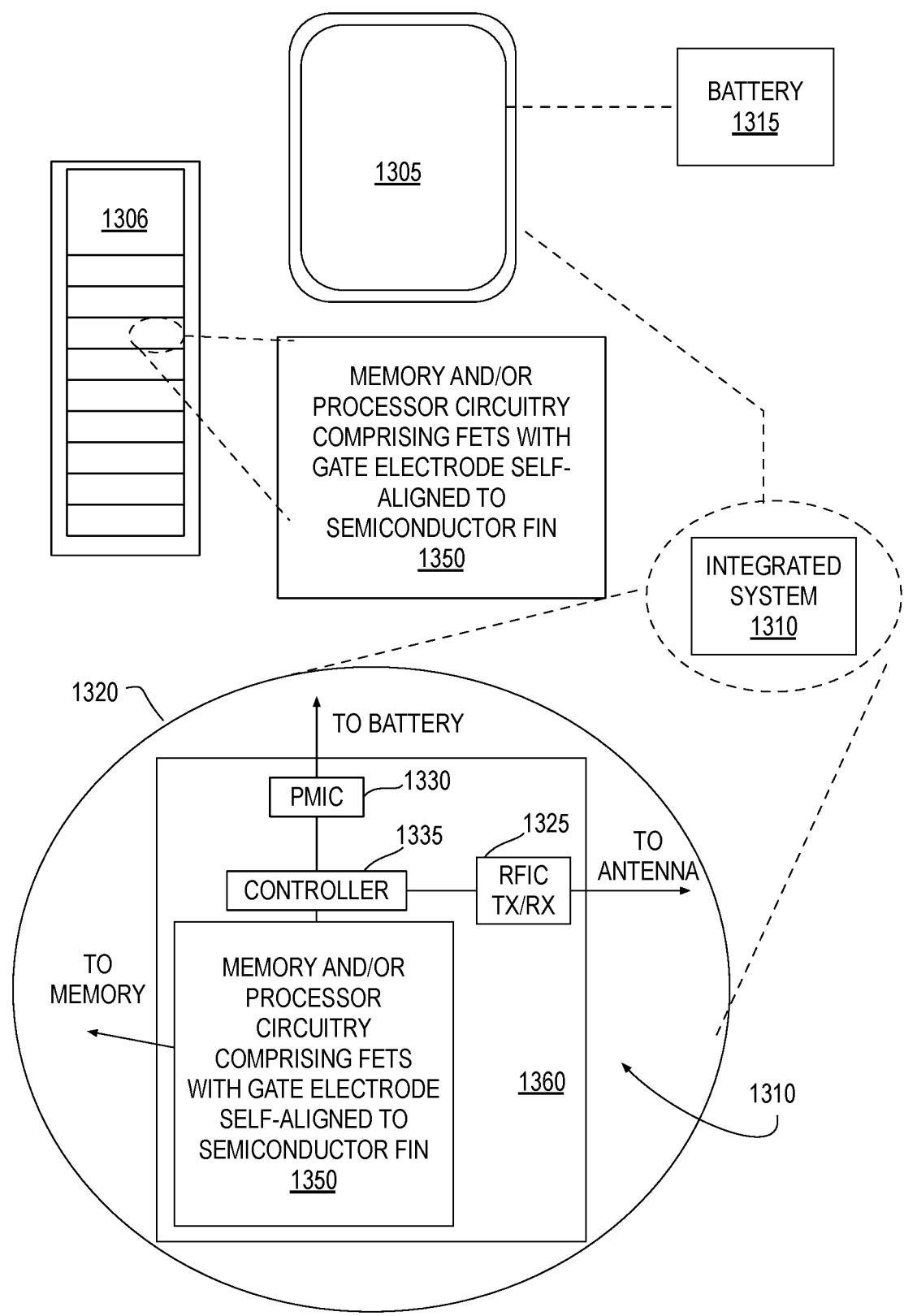
FIG. 13 illustrates a mobile computing platform and a data server machine employing an SoC including a plurality of high-mobility finFETs including a gate electrode self-aligned to a semiconductor fin, in accordance with embodiments of the present invention.

FIG. 13 illustrates a mobile computing platform and a data server machine employing an SoC including high-mobility FETs with a gate electrode self-aligned to a semiconductor fin, for example as describe elsewhere herein. The server machine 1306 may be any commercial server, for example including any number of high-performance computing platforms disposed within a rack and networked together for electronic data processing, which in the exemplary embodiment includes a packaged monolithic SoC 1350. The mobile computing platform 1305 may be any portable device configured for each of electronic data display, electronic data processing, wireless electronic data transmission, or the like. For example, the mobile computing platform 1305 may be any of a tablet, a smart phone, laptop computer, etc., and may include a display screen (e.g., a capacitive, inductive, resistive, or optical touchscreen), a chip-level or package-level integrated system 1310, and a battery 1315.

Whether disposed within the integrated system 1310 illustrated in the expanded view 1320, or as a stand-alone packaged chip within the server machine 1306, packaged monolithic SoC 1350 includes a memory block (e.g., RAM), a processor block (e.g., a microprocessor, a multi-core microprocessor, graphics processor, or the like) including at least one finFET with a gate electrode self-aligned to a semiconductor fin, for example as describe elsewhere herein. The monolithic SoC 1350 may be further coupled to a board, a substrate, or an interposer 1360 along with, one or more of a power management integrated circuit (PMIC) 1330, RF (wireless) integrated circuit (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335.

Functionally, PMIC 1330 may perform battery power regulation, DC-to-DC conversion, etc., and so has an input coupled to battery 1315 and with an output providing a current supply to other functional modules. As further illustrated, in the exemplary embodiment, RFIC 1325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 1350.

Figure 14:
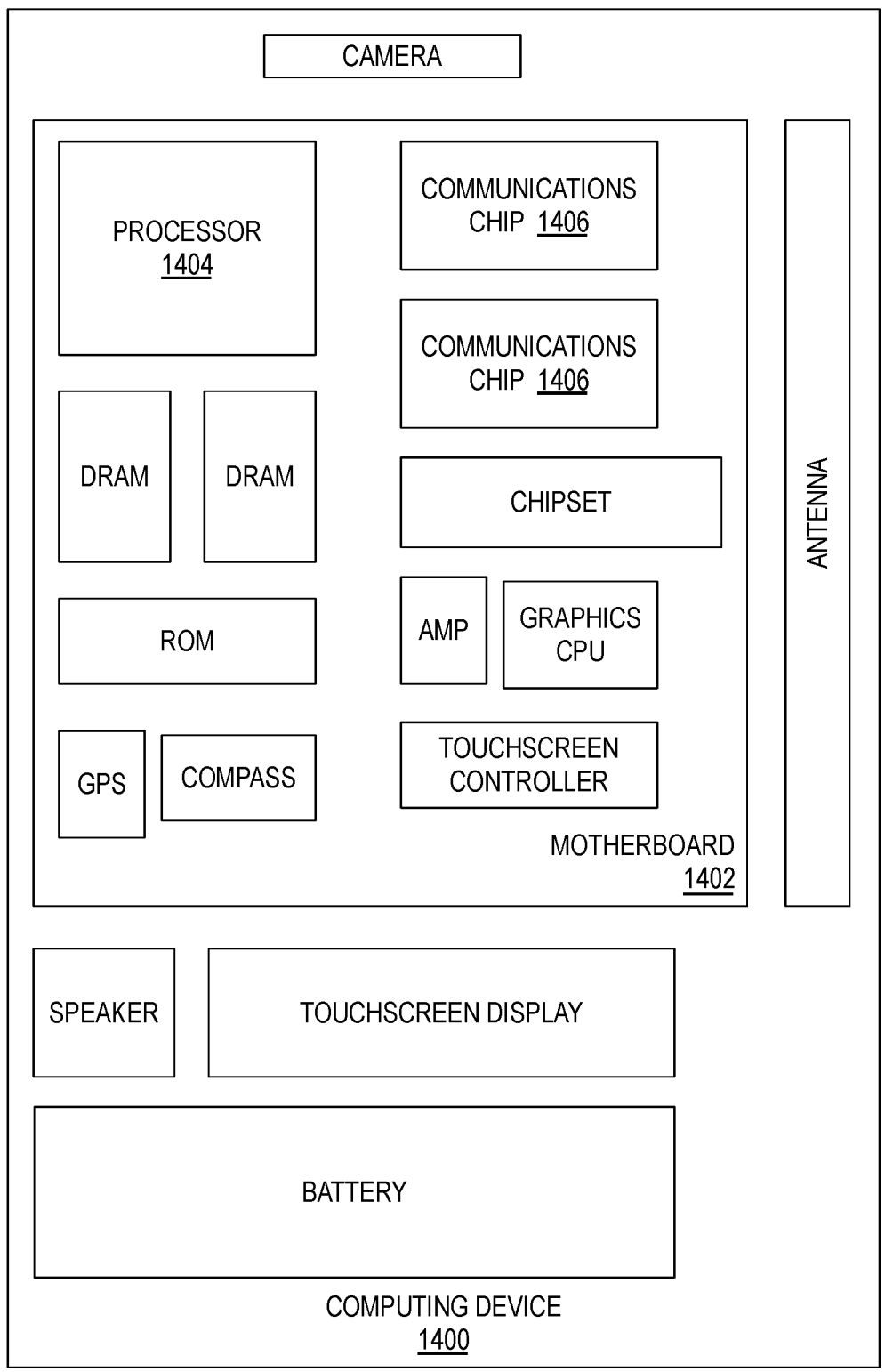
FIG. 14 is a functional block diagram of an electronic computing device, in accordance with an embodiment of the present invention.

FIG. 14 is a functional block diagram of an electronic computing device, in accordance with an embodiment of the present invention. Computing device 1400 may be found inside platform 1305 or server machine 1306, for example. Device 1400 further includes a motherboard 1402 hosting a number of components, such as, but not limited to, a processor 1404 (e.g., an applications processor), which may further incorporate at least one high-mobility finFET with a retrograde source/drain region, for example as describe elsewhere herein. Processor 1404 may be physically and/or electrically coupled to motherboard 1402. In some examples, processor 1404 includes an integrated circuit die packaged within the processor 1404. In general, the term "processor" or "microprocessor" may refer to any device or portion of a device that processes electronic data from registers and/or memory to transform that electronic data into other electronic data that may be further stored in registers and/or memory.

In various examples, one or more communication chips 1406 may also be physically and/or electrically coupled to the motherboard 1402. In further implementations, communication chips 1406 may be part of processor 1404. Depending on its applications, computing device 1400 may include other components that may or may not be physically and electrically coupled to motherboard 1402. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1406 may implement any of a number of wireless standards or protocols, including but not limited to those described elsewhere herein. As discussed, computing device 1400 may include a plurality of communication chips 1406. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a field effect transistor (FET), comprises a sub-fin comprising a first semiconductor material and having a sidewall adjacent to an isolation dielectric; a fin disposed on the sub-fin and laterally overhanging the isolation dielectric, wherein the fin comprises a second semiconductor material having a different composition than the first semiconductor material; a gate electrode and gate dielectric disposed over the fin within a channel region of the FET; and source/drain regions disposed on opposite sides of the gate electrode and coupled to the channel region.

In second examples, an interface of the isolation dielectric and either the gate electrode or gate dielectric is planar with an interface of the fin and the sub-fin.

In third examples, for either the first or second examples, the fin extends laterally over the isolation dielectric by a distance that is less than half a vertical height of the fin.

In fourth examples, for any of the first, second, or third examples, the transverse width of the fin is greater at a top of the fin than at an interface of the fin and the sub-fin.

In fifth examples, for any of the first, second, third or fourth examples, the first semiconductor has a conductivity type complementary to that of the second semiconductor, or has a bandgap larger than that of the second semiconductor.

In sixth examples, for any of the first, second, third, fourth, or fifth examples, the second semiconductor is an $In_xGa_{1-x}As$ alloy and the first semiconductor is a binary or ternary alloy comprising Ga and As.

In seventh examples, for any of the first, second, third, fourth, fifth, or sixth examples the FET further includes a fin cladding comprising a third semiconductor material disposed on at least a sidewall of the fin.

In eighth examples, for any of the seventh examples, the fin and the fin cladding laterally overhang the isolation dielectric.

In ninth examples, for any of the seventh and eighth examples, a transverse width of the fin is greater at a top of the fin than at an interface of the fin and the sub-fin.

In tenth examples, for any of the seventh, eighth and ninth examples, the fin and the fin cladding are both $In_xGa_{1-x}As$ alloys, and x in the fin is greater than x in the fin cladding.

In eleventh examples, for any of the first, second, third, fourth, fifth, sixth, seventh, eighth, or ninth examples, an interface of the sub-fin and a source/drain region is planar with an interface of the source/drain region and the isolation dielectric.

In twelfth examples, a CMOS integrated circuit (IC) comprises an n-type fin field effect transistor (finFET) disposed over a first region of a substrate. The n-type finFET further includes a sub-fin comprising a first III-V semiconductor material, wherein the sub-fin has a sidewall adjacent to an isolation dielectric. The n-type finFET further includes a fin disposed on the sub-fin, wherein the fin comprises a second III-V semiconductor material laterally overhanging the dielectric. The n-type finFET further includes a gate electrode and gate dielectric disposed over the fin within a channel region of the finFET, wherein an interface between the isolation dielectric and either the gate electrode or gate dielectric is planar with an interface between the fin and sub-fin. The n-type finFET further includes source/drain regions disposed on opposite sides of the gate electrode and coupled to the channel region. The CMOS IC further includes a p-type finFET disposed over a second region of the substrate, the p-type finFET including a second fin comprising a group IV semiconductor.

In thirteenth examples, for the twelfth examples the second fin does not laterally overhang the isolation dielectric.

In fourteenth examples, a method of fabricating a field effect transistor (FET) comprises forming a sub-fin comprising a first semiconductor material. The method comprises planarizing the sub-fin with an isolation dielectric adjacent to sidewall of the sub-fin. The method comprises epitaxially growing a fin from the planarized surface of the sub-fin, the fin comprising a second semiconductor. The method comprises forming a mask over a channel region of the fin. The method comprise epitaxially growing source/drain semiconductor on a fin or sub-fin surface not covered by the mask.

In fifteenth examples, forming the mask further comprises forming a gate electrode and gate dielectric over the channel region. Forming the sub-fin further comprises forming a trench in the isolation dielectric, the trench exposing a surface of a substrate, and epitaxially growing a first III-V semiconductor within the trench. Forming the fin further comprises epitaxially growing a second III-V semiconductor seeded from the planarized surface of the sub-fin, the first and second III-V semiconductors forming a heterojunction that is aligned with an interface of the isolation dielectric and the gate electrode or gate dielectric.

In sixteenth examples, growing the second III-V semiconductor further comprises a lateral epitaxial overgrowth of the second III-V semiconductor.

In seventeenth examples, the method further comprises wet etching the fin prior to forming the mask, and without recessing the isolation dielectric below the top surface of the sub-fin.

In eighteenth examples, for any of the fourteenth, fifteenth, sixteenth or seventeenth examples, the method further comprises epitaxially growing a fin cladding over the second III-V semiconductor material, the fin cladding further comprising a third III-V semiconductor material.

In nineteenth examples, for any of the fourteenth, fifteenth, sixteenth, seventeenth, or eighteenth examples, forming the mask over the channel region further comprises depositing a sacrificial gate electrode over the fin, patterning the sacrificial gate electrode into a mandrel extending over the channel region, and forming a gate sidewall spacer adjacent to sidewalls of the mandrel. The method further comprises replacing the mandrel with a permanent gate stack comprising a high-k gate dielectric and a metal gate electrode.

In twentieth examples, for any of the fifteenth, sixteenth, seventeenth, or eighteenth examples the first III-V semiconductor comprises at least Ga and As, and the second III-V semiconductor comprises $In_xGa_{1-x}As$, wherein x is at least 0.60.

In twenty-first examples, a mobile computer platform, comprises a battery, a memory, and a processor coupled to the battery and memory, wherein the processor includes the CMOS IC of the twelfth or thirteenth examples.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A field effect transistor (FET), comprising:
    a sub-fin comprising a first semiconductor material and having a sidewall adjacent to an isolation dielectric;
    a fin on the sub-fin, wherein the fin laterally overhangs the isolation dielectric, and wherein the fin comprises a second semiconductor material having a different composition than the first semiconductor material;
    a gate electrode and gate dielectric over the fin within a channel region of the FET wherein an interface of the isolation dielectric and either the gate electrode or gate dielectric is coplanar with an interface of the fin and the sub-fin; and
    source and drain regions on opposite sides of the gate electrode and coupled to the channel region, wherein the source and drain regions comprise a third semiconductor material having a different composition than the first or second semiconductor material, wherein the source and drain regions laterally overhang the isolation dielectric, and wherein an interface of the source and drain regions with the isolation dielectric is coplanar with an interface of the fin and the subfin.

2. The transistor of claim 1, wherein:
    the source and drain regions consist of the third semiconductor material.

3. The transistor of claim 1, wherein:
    the fin extends laterally over the isolation dielectric by a distance that is less than half a vertical height of the fin.

4. The transistor of claim 1, wherein the transverse width of the fin is greater at a top of the fin than at an interface of the fin and the sub-fin.

5. The transistor of claim 1, wherein the first semiconductor has a conductivity type complementary to that of the second semiconductor, or has a bandgap larger than that of the second semiconductor.

6. The transistor of claim 1, wherein the second semiconductor is an $In_xGa_{1-x}As$ alloy and the first semiconductor is a binary or ternary alloy comprising Ga and As.

7. The transistor of claim 1, wherein the FET further includes a fin cladding comprising a third semiconductor material on at least a sidewall of the fin, and wherein the fin and the fin cladding laterally overhang the isolation dielectric.

8. The transistor of claim 7, wherein a transverse width of the fin is greater at a top of the fin than at an interface of the fin and the sub-fin.

9. The transistor of claim 7, wherein the fin and the fin cladding are both $In_xGa_{1-x}As$ alloys, and x in the fin is greater than x in the fin cladding.

10. The transistor of claim 1, wherein an interface of the sub-fin and a source and drain regions is coplanar with an interface of the source and drain regions and the isolation dielectric.

11. A CMOS integrated circuit (IC), comprising:
    an n-type fin field effect transistor (finFET) over a first region of a substrate, the n-type finFET further including:
        a sub-fin comprising a first III-V semiconductor material, wherein the sub-fin has a sidewall adjacent to an isolation dielectric;
        a fin disposed on the sub-fin, wherein the fin comprises a second III-V semiconductor material that laterally overhangs the isolation dielectric;
        a gate electrode and gate dielectric over the fin within a channel region of the finFET, wherein an interface between the isolation dielectric and either the gate electrode or gate dielectric is coplanar with an interface between the fin and the sub-fin; and
        source and drain regions on opposite sides of the gate electrode and coupled to the channel region; and
    a p-type finFET over a second region of the substrate, the p-type finFET including a second fin comprising a group IV semiconductor, wherein the second fin does not laterally overhang the isolation dielectric.

* * * * *